United States Patent [19]

O'Connor et al.

[11] Patent Number: 4,882,259

[45] Date of Patent: Nov. 21, 1989

[54] PHOTOSENSITIVE IMAGING MATERIAL EMPLOYING PHOTOSENSITIVE MICROCAPSULES CONTAINING A SOLID DILUENT

[75] Inventors: Joseph G. O'Connor; Paul C. Adair, both of Springboro, Ohio

[73] Assignee: The Mead Corporation, Dayton, Ohio

[21] Appl. No.: 855,032

[22] Filed: Apr. 22, 1986

Related U.S. Application Data

[63] Continuation of Ser. No. 659,151, Oct. 9, 1984, abandoned, and a continuation of Ser. No. 814,521, Dec. 19, 1985, abandoned, which is a continuation of Ser. No. 643,569, Aug. 23, 1984, abandoned.

[51] Int. Cl.$^4$ ............................. G03C 1/72; B41M 5/12
[52] U.S. Cl. ................................... 430/138; 430/281; 430/917; 430/918; 427/213.31; 428/402.2; 428/402.21; 428/402.24; 252/600
[58] Field of Search ............... 430/138, 281, 917, 918; 427/213.31; 428/402.2, 402.21, 402.24; 252/600

[56] References Cited

U.S. PATENT DOCUMENTS

| | | | |
|---|---|---|---|
| 3,871,885 | 3/1975 | Hertler | 430/281 |
| 3,994,827 | 11/1976 | Sakai et al. | 252/316 |
| 4,307,169 | 12/1981 | Matkan | 430/111 |
| 4,399,209 | 8/1983 | Sanders et al. | 430/138 |
| 4,440,846 | 4/1984 | Sanders et al. | 430/138 |
| 4,489,151 | 12/1984 | Sanders et al. | 430/138 |

FOREIGN PATENT DOCUMENTS

2822961 11/1978 Fed. Rep. of Germany.

Primary Examiner—Paul R. Michl
Assistant Examiner—Patrick A. Doody
Attorney, Agent, or Firm—Smith & Schnacke

[57] ABSTRACT

An imaging material of the type in which a radiation sensitive composition is encapsulated in a plurality of microcapsules and exposure controls the release of the internal phase from the microcapsules wherein the internal phase of the microcapsules includes a solid diluent.

8 Claims, No Drawings

PHOTOSENSITIVE IMAGING MATERIAL EMPLOYING PHOTOSENSITIVE MICROCAPSULES CONTAINING A SOLID DILUENT

CROSS-REFERENCE TO RELATED APPLICATIONS

This application is a combined continuation of U.S. application Ser. No. 659,151 filed Oct. 9, 1984 and U.S. application Ser. No. 814,521 filed Dec. 19, 1985 which is a continuation of U.S. application Ser. No. 643,569 filed Aug. 23, 1984, all of which are abandoned.

BACKGROUND OF THE INVENTION

The present invention relates to an imaging material of the type in which a layer of photosensitive microcapsules is provided on a photographic support and, more particularly, to an improved imaging material in which the microcapsules contain a solid diluent in the internal phase.

U.S. Pat. Nos. 4,399,209 and 4,440,846, assigned to The Mead Corporation, describe transfer and self-contained imaging systems in which the imaging sheet comprises a support carrying a layer of photosensitive microcapsules. The microcapsules contain an internal phase which includes a photosensitive composition which undergoes a change in viscosity upon exposure to actinic radiation. The photosensitive composition is typically a photohardenable composition such as a composition which undergoes free radical addition polymerization. The imaging materials can be used to form dye images or light scattering images. Most typically an image-forming agent, such as a substantially colorless electron donating compound, which generates a colored dye upon reaction with a developer, is encapsulated with the photosensitive composition in the internal phase of the microcapsules. In self-contained imaging systems, the co-reactive developer material is provided on the surface of the imaging sheet with the photosensitive microcapsules. In transfer imaging systems the developer is provided on a separate sheet.

To form images, the above described imaging sheets are image-wise exposed to actinic radiation and subjected to a uniform rupturing force whereupon the microcapsules rupture and image-wise release the internal phase. In the case of microcapsules containing a photohardenable composition, the internal phase is released in the areas which are not exposed to actinic radiation or areas which are underexposed. In these areas, the microcapsules rupture and the internal phase remains sufficiently fluid to be released from the microcapsules. Thus, in these areas the image-forming agent associated with the microcapsules can react with the developer material and produce a color image. In the fully exposed areas, the microcapsules are either incapable of rupturing or, if they do rupture, the internal phase is too viscous to be released from the capsules. A detailed explanation of these imaging materials and the process whereby images are formed can be found in both of the aforementioned patents.

SUMMARY OF THE INVENTION

A principal object of the present invention is to provide an imaging material employing photosensitive microcapsules having improved film speed.

Another object of the present invention is to provide an imaging material employing photosensitive microcapsules having lower gamma and a broader dynamic range.

In accordance with the present invention a solid diluent is added to the internal phase of the microcapsules. While not desiring to be bound it is believed the diluent forms a solid array in which the photosensitive composition is entrapped or the diluent lines the inside wall of the microcapsule and insulates the photosensitive composition from the effects of oxygen. Oxygen is known to inhibit photopolymerization (see commonly assigned U.S. Pat. No. 4,482,624). The solid diluent is believed to reduce the rate with which oxygen, which is consumed by the photochemical reactions in the microcapsule, is replaced. The wax may shield the internal phase from oxygen or reduce the solubility of oxygen in the internal phase. An increase in the film speed of the microcapsules of the present invention is observed.

In addition to increasing speed through reduced oxygen sensitivity, the diluent is also believed to improve film speed by reducing the amount of polymerization which must occur before the capsule is hardened to a point where exposure controlled release of the internal phase occurs. For example, less exposure is required to lock the internal phase in the microcapsules to produce white background areas.

The addition of the solid diluent to the microcapsules also improves the handling characteristics the imaging sheet. Similar to the microcapsules used in pressure-sensitive recording sheets, photosensitive microcapsules can be easily ruptured when the imaging sheet is handled, processed, or stacked for storage. This can lead to undesirable background spotting and smudging. It has been found that when a solid diluent is incorporated in the internal phase of the microcapsules, they resist smudging and have improved handling characteristics.

The solid diluent is also believed to improve storage stability. For example, imaging sheets prepared with wax-containing microcapsules are less sensitive to humidity and, as such, retain their photographic qualities upon storage.

Thus, one embodiment of the present invention resides in an imaging material comprising a support having a layer of photosensitive microcapsules on the surface thereof, said microcapsules including an internal phase containing a photohardenable composition and a solid diluent.

In accordance with the preferred embodiments of the invention, the microcapsules have discrete capsule walls and the internal phase additionally includes an image-forming agent, such as a substantially colorless electron donating compound which forms a color upon reaction with an electron accepting compound such as acid clay or a salt of a salicylic acid derivative.

In accordance with still more preferred embodiments of the invention, the photohardenable composition is a composition which undergoes free radical addition polymerization such as a composition including an ethylenically unsaturated compound and a photoinitiator.

DEFINITIONS

The term "microcapsule" as used herein includes both microcapsules having a discrete capsule wall and so-called open phase microcapsules formed by dispersing the internal phase in a binder.

The term "actinic radiation" as used herein includes the entire electromagnetic spectrum including visible light, ultraviolet and infrared radiation, and particle radiation such as X-ray and ion beam radiation. The preferred forms of actinic radiation are ultraviolet radiation and visible light having a wavelength of about 190–800 nm and, more preferably, 380–480 nm. pde

DETAILED DESCRIPTION OF THE INVENTION

U.S. Pat. Nos. 4,399,209 and 4,440,846 are hereby incorporated by reference.

The imaging material of the present invention is characterized in that the internal phase of the microcapsules includes a solid diluent. The solid diluents used in the present invention are characterized in that they are solids at room temperature (23° C.), they are nonreactive, and they are compatible with the photosensitive composition (e.g., they do not detract from its ability to react upon exposure to actinic radiation). The solid diluent is an organic compound which can be melted, mixed with the other components of the internal phase, and encapsulated. The diluent is preferably, but not necessarily, miscible (as a melt) with the photosensitive composition and, more particularly, with an ethylenically unsaturated compound.

A particularly useful class of solid diluent useful in the present invention is waxes and more particularly waxes melting in the range of 35° to 100° C. and preferably 35° to 85° C. Other organics having the aforementioned properties are also useful solid diluents such as certain aromatic hydrocarbons.

The waxes used in the present invention may be synthetic waxes (e.g., fatty alcohols, fatty acids, fatty acid esters and glycerides, hydrogenated oils, ketones, amines, amides, chlorinated waxes, synthetic hydrocarbon waxes, synthetic animal waxes, etc.) or natural waxes (e.g., paraffinic waxes, microcrystalline waxes, mineral waxes, vegetable waxes and animal waxes). The wax cannot be so hard that when admixed with the photosensitive composition, the capsule will not rupture and release the internal phase. The wax may be miscible with the photosensitive composition or be immiscible and present in the microcapsule as a distinct, separate phase.

Typical examples of waxes useful in the present invention include fatty alcohols (e.g., 1-docosanol, 1-octadecanol); long chain alkyl hydrocarbons (e.g., octocosane); deresinated, oxidized mineral waxes (e.g., molten wax); amide waxes (e.g., stearamide waxes), behenamide waxes, fatty acid waxes, hydroxylated fatty acid waxes, hydroxy stearate waxes, oxazoline waxes, amine waxes and mixtures thereof. Waxes of vegetable origin that appear to be useful herein include carnauba wax and castor wax. Non-polar hydrocarbon waxes are also useful in the present invention. Among the commercially available waxes useful in the present invention are Histowax and Beeswax.

Other examples of useful solid diluents include aromatic hydrocarbons such as bibenzyl, biphenyl and pentamethylbenzene; aromatic ethers such as p-diethoxybenzene and 1,2-diphenoxyethane, and cyclic alcohols such as cyclododecanol.

The solid diluent is used in an amount that improves film speed. The diluent is typically used in an amount of about 2.5 to 100 parts by weight (preferably 5 to 50 parts by weight) per 100 parts by weight of the photosensitive composition.

The solid diluent can be encapsulated in the internal phase of the microcapsules by melting the wax, admixing it with a heated photosensitive composition and at an elevated temperature forming a wall therearound using conventional encapsulation techniques such as coacervation or interfacial polymerization or by dispersing the mixture in an appropriate binder.

The photosensitive microcapsules of the present invention are easily formed using known encapsulation techniques. The photosensitive composition and associated agents can be encapsulated in hydrophilic wall-forming materials such as gelatin-type materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanatepolyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle).

A preferred microcapsule is one having a discrete capsule wall formed from a urea-formaldehyde or urea-resorcinol-formaldehyde copolymer.

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The photosensitive compositions used in the present invention are photohardenable compositions which undergo an increase in viscosity upon exposure to actinic radiation. The photohardenable compositions described in the patents which have been incorporated by reference may be used herein. Preferred compositions comprise an ethylenically unsaturated compound and a photoinitiator system. Typically, the ethylenically unsaturated compounds contain two or more terminal or pendant vinyl or allylic groups. Such compounds are well-known in the art and include acrylic and methacrylic esters of polyhydric alcohols, trimethylolpropane, pentaerythritol, and the like. Representative examples include ethylene glycol diacrylate, ethylene glycol dimethacrylate, trimethylolpropane triacrylate (TMPTA), trimethylolpropane trimethacrylate (TMPTMA), pentaerythritol tetraacrylate, pentaerythritol tetramethacrylate, hexanediol-1,6-dimethacrylate, diethyleneglycol dimethacrylate, and dipentaerythritol hydroxypentaacrylate. Commercially available photopolymers such as acrylate and methacrylate terminated polyesters and polyethers are also useful in the present invention.

The photosensitive compositions used in the present invention usually include a photoinitiator system. The photoinitiator system may include a sensitizer. An absorber may also be used in combination with the system to adjust the sensitivity of the photosensitive composition. Photoinitiators which generate free radicals upon photochemical cleavage (homolytic initiators) such as certain benzoin ethers and initiators which function via hydrogen abstraction are useful. Diaryl ketone derivatives and benzoin alkyl ethers are particularly useful. Specific examples of useful initiator systems include benzophenone, Michler's ketone, benzoin methyl ether, and 2,2'-dimethoxy-2-phenylacetophenone, isopropylxanthone, isopropylthioxanthone, (ethyl para-dimethylaminobenzoate), and ketocoumarin compounds as described in U.S. Pat. No. 4,147,552, etc.

The photoinitiator is present in the photosensitive composition an amount effective to initiate polymerization or crosslinking. For example, isopropylthioxanthone is typically present in an amount up to about 10% by weight based on the weight of the photocrosslinkable or photopolymerizable material present in the photosensitive composition. The exact amount of photoinitiator used will vary with the nature of the photosensitive composition.

Ultraviolet sensitive microcapsules are generally preferred because they can be handled in room light for short periods of time. They are also useful for copying from a CRT screen. One disadvantage of ultraviolet sensitive systems, however, is that many printed documents are on a paper which includes optical brighteners which absorb ultraviolet radiation. Accordingly, to copy printed documents, blue light sensitive systems are advantageous.

In accordance with certain embodiments of the present invention (particularly those embodiments in which the photosensitive composition contains a photopolymerizable monomer such as TMPTA), the photosensitive composition may include an oligomeric and/or a polymeric material to further increase the film speed of the microcapsules. Typically, these materials range from about 800 to 3,000 in average molecular weight in the case of oligomers and up to 40,000 in molecular weight in the case of polymers. The oligomer or polymer may be reactive, i.e., curable or polymerizable by free radical initiated polymerization, or not reactive. In both cases, it enhances the film speed by increasing the rate with which the viscosity of the composition reaches a level at which the microcapsules can be differentially ruptured.

Representative examples of some commercially available oligomers which are useful in the present invention include Ebecryl 240, Ebecryl 270, Ebecryl 810 (Virginia Chemicals Inc.); DER 662, DER 663U, DER 664U (Dow Chemical Co.); Cargill 1570 (Cargill); Uvithane 893 (Morton Thiokol Inc.); Diallyl-o-phthalate prepolymer (Polysciences); polyvinylpyrrolidone (GAF).

In some cases it is advantageous to include a polythiol in the photosensitive composition to improve sensitivity (film speed). Useful polythiols contain 2 or more terminal or pendant —SH groups. Examples of polythiols that are desirable for use in the present invention are esters of thioglycolic acid and β-mercaptopropionic acid.

Representative examples of the polythiols include ethylene glycol bis (thioglycolate), ethylene glycol bis (β-mercaptopropionate), trimethylolpropane tris (thioglycolate), pentaerythritol tetrakis (thioglycolate) and the most preferred pentaerythritol tetrakis (β-mercaptopropionate), dipentaerytrritol hexa (β-mercaptopropionate), and trimethylolpropane tris (β-mercaptopropionate), and mixtures thereof. These compounds are commercially available. Certain polymeric polythiols such as polypropylene ether glycol bis (β-mercaptopropionate) which is prepared by esterification of polypropylene ether glycol may also be useful.

One example of an image-forming agent useful in the invention is a colorless electron donating compound. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone, Copikem X, IV, XI, XX (Hilton-Davis Co.), and Reakt Yellow (BASF Aktiengesellschaft) are often used alone or in combination as color precursors in the present invention.

Illustrative examples of color developers useful in conjunction with the electron donating type color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5-di-tert-butyl salicylate (see U.S. Pat. Nos. 3,864,146 and 3,934,070), zinc 3,5-di(-methylbenzyl) salicylate oil soluble metal salts or phenol-formaldehyde novolak resins (e.g., see U.S. Pat. Nos. 3,672,935; 3,732,120 and 3,737,410) such as zinc modifefed oil soluble phenol-formaldehyde resin as disclosed in U.S. Pat. No. 3,732,120, zinc carbonate etc., and mixtures thereof.

Images can also be formed using as the image-forming agent, a chelating agent which reacts with a metal salt, as a developer, to generate a color image upon being released from the microcapsules. Some typical examples of useful image-forming pairs of this type are nickel nitrate, and N,N' bis (2-octanoyloxyethyl)dithiooxamide, and alum [Fe(III)]and yellow prussiate.

Substantially any color-forming agent which can be encapsulated and which will react with a developer material to form an image can be used in the present invention. Furthermore, either the color former or the color developer may be associated with the microcapsules. It is not always necessary to encapsulate the color former, as is the conventional practice.

As a further alternative, the capsules may contain a visible dye or pigment. Substantially any benign colored dye, i.e., a dye which does not detrimentally attenuate the exposure radiation can be used in this embodiment. A few examples are Sudan Blue and Rhodamine B dyes. Certain pigments or toners can also be used.

The image-forming agent may be associated with the microcapsules in various ways such that upon release of the internal phase, the image-forming agent is able to react and/or migrate to produce an image. It is typically encapsulated with the photosensitive composition, in the microcapsules, however, it may also be incorporated in the walls of microcapsules having discrete walls or in the binder of an open phase system. Those skilled in the art will appreciate that various arrangements can be used provided that the activation or mobilization of the image-forming agent is controlled by rupturing the microcapsules and releasing the internal phase.

The image-forming agent is used in an amount sufficient to produce a visible image of the desired density upon reaction with a developer or upon transfer. In general, the image-forming agent is present in an amount of approximately 0.5 to 25% by weight based on the weight of the photopolymerizable or photocrosslinkable species. A preferred range is about 2 to 10% by weight.

The most common substrate for the image-receiving sheet is paper. The paper may be a commercial impact raw stock, or a special grade paper such as cast-coated paper or chrome-rolled paper. Transparent substrates such as polyethylene terephthalate and translucent substrates can also be used in this invention.

The teachings of the present invention can be used in conjunction with both transfer and self-contained imaging systems as described in U.S. Pat. Nos. 4,399,209 and 4,440,846. In addition, the teachings herein can be used in conjunction with full color imaging systems as described in U.S. application Ser. No. 339,917, filed Jan. 18, 1982, now U.S. Pat. No. 4,842,976, and U.S. application Ser. No. 620,994, filed June 15, 1984, now U.S. Pat. No. 4,576,891, which are also incorporated herein by reference.

The present invention is illustrated in more detail by the following nonlimiting examples. Unless otherwise indicated, all percentages are by weight.

EXAMPLE 1

Microcapsules containing, as the internal phase, 2 g Quanticure EPD (Ward-Blenkinsop, Ltd.), 0.1 g 7-diethylamino-3-cinnamoyl coumarin, and 3 g Crystal Violet Lactone, 50 g trimethylolpropane triacrylate (TMPTA), 2.5 g Beeswax, 1.67 g SF-50 (a product of Union Carbide Company), and 3.33 g N-100 (a product of Mobay Chemical Corporation) were prepared by the following encapsulation procedure:

Capsule Preparation

1. Into a 600 ml stainless steel beaker, 100 g water and 26 g isobutylene maleic anhydride copolymer (20.6%) are weighed.
2. The beaker is clamped in place on a hot plate under an overhead mixer. A six-bladed, 45° pitch, turbine impeller is used on the mixer.
3. After thoroughly mixing, 3.1 g pectin is slowly sifted into the beaker. This mixture is stirred for 20 minutes.
4. The pH is adjusted to 4.0 using a 20% solution of $H_2SO_4$, and 0.2 g Quadrol (2-hydroxypropyl ethylenediamine with propylene oxide from, BASF) is added.
5. The mixer is turned up to 3000 rpm and the internal phase is added over a period of 10–15 seconds. Emulsification is continued for 10 minutes.
6. At the start of emulsification, the hot plate is turned up so heating continues during emulsification.
7. After 10 minutes, the mixing speed is reduced to 2000 rpm and 16.6 g urea solution (50% w/w), 0.8 g resorcinol in 10 g water, 21.4 g formaldehyde (37%), and 0.6 g ammonium sulfate in 10 ml water are added at two-minute intervals.
8. The beaker is covered with foil and a heat gun is used to help bring the temperature of the preparation to 65° C. When 65° C. is reached, the hot plate is adjusted to maintain this temperature for a two to three hour cure time during which the capsule walls are formed.
9. After curing, the heat is turned off and the pH is adjusted to 9.0 using a 20% NaOH solution.
10. Dry sodium bisulfite (2.8 g) is added and the capsule preparation is cooled to room temperature.

IMAGING SHEET PREPARATION

The microcapsule preparation, so obtained, was diluted 1:1 with water containing 0.5% Triton X-100 surfactant (Rohm & Haas Co.) and coated on 80 pound Black and White paper (The Mead Corporation) using a number 12 wire wound rod.

After drying, the sheets were exposed for 4 seconds with a light source consisting of one 15T8/BL and one 15T8/D fluorescent tube through a 2 step wedge from VWR at a distance of 6 inches from the light source. The imaging material exhibited the following photographic characteristics:

|  | Step # |
| --- | --- |
| $D_{10}$ | 6.69 |
| $D_{50}$ | 8.44 |
| $D_{90}$ | 10.68 |
| Dynamic Range | 3.98 |
| Gamma | −1.844 |

EXAMPLE 2

Microcapsules containing 45 g Photomer 4149 (a product of Sartomer), 5 g Histowax (a product of Fisher Scientific), 2 g Quanticure EPD (Ward-Blenkinsop, Ltd.), 0.1 g 7-diethylamino-3-cinnamoyl coumarin, 1 g Crystal Violet Lactone, 3 g Reakt Yellow (a product of BASF Aktiengesellschaft), 0.75 g Copikem 20 (Hilton-Davis Chemical Co.), 1.67 g SF 50 (a product of Union Carbide Company), and 3.33 g N-100 (a product of Mobay Chemical Company), were prepared by following the same procedure outlined in Example 1. Imaging sheets were prepared and image-wise exposed as in Example 1. The imaging material exhibited the following photographic characteristics (gamma value and the dynamic range shown below).

|  | Step # |
| --- | --- |
| $D_{10}$ | 6.82 |
| $D_{50}$ | 10.33 |
| $D_{90}$ | 14.77 |
| Dynamic Range | 7.96 |
| Gamma | −0.640 |

EXAMPLE 3

Microcapsules containing, as the internal phase, 6 g Quanticure BMS (Ward-Blenkinsop, Ltd.), 2 g Quanitcure EPD (Ward-Blenkinsop, Ltd.), and 1 g Crystal Violet Lactone, and amounts of trimethylolpropane triacrylate (TMPTA) and 1,2-diephenoxyethane to total 50 g, as shown in Table 1 below were prepared by the following encapsulation procedure described in Example 1.

The gamma values and the step number corresponding to 90%, 50%, and 10% Dmax are shown in Table 1 below:

| Internal Phase | Gamma | 90% | 50% | 10% |
| --- | --- | --- | --- | --- |
| TMPTA (50 g) | 3.1 | 10.41 | 9.07 | 7.64 |
| TMPTA (34 g) 1,2-Diphenoxyethane (16 g) | 1.7 | 11.72 | 9.90 | 7.53 |
| TMPTA (25 g) 1,2-Diphenoxyethane (16 g) | 1.0 | 12.69 | 9.87 | 5.93 |

As Table 1 shows, the addition of 1,2-Diphenoxyethane reduces the gamma value of the imaging material from 3.0 to 1.0. Similarly, the dynamic range (the number of steps between 90% and 10% Dmax) increases from approximately 3 steps to approximately 7 steps. Thus, the addition of crystalline organic compounds such as 1,2-Diphenoxyethane represents a viable means of reducing gamma and, at the same time, providing a high speed photographic system.

EXAMPLE 4

Microcapsules containing 6 g Quanticure BMS (Ward-Blenkinsop, Ltd.), 2 g Quanticure EPD (Ward-Blenkinsop, Ltd.), 1 g Crystal Violet Lactone, 25 g trimethylpropanetriacrylate and 25 g cyclododecanol, as the crystalline organic compound, were prepared by following the same procedure outlined in Example 1. Imaging sheets were prepared and image-wise exposed as in Example 1. The imaging material exhibited the gamma value and the dynamic range shown in Table 2 below.

| Internal Phase | Gamma | Speed (Step #1) 90% | 50% | 10% |
| --- | --- | --- | --- | --- |
| TMPTA (25 g) Cyclododecanol (25 g) | 0.74 | 11.75 | 8.29 | 3.53 |

Having described the invention in detail and by reference to specific embodiments thereof, it will be evident that numerous modifications and variations are possible without departing from the scope of the invention as defined by the following claims:

What is claimed is:

1. An imaging material comprising a support having on the surface thereof a layer of photosensitive microcapsules having discrete capsule walls, said microcapsules containing an internal phase including a photohardenable composition, an image-forming agent, and a solid diluent, said image-forming agent being a substantially colorless electron donating compound, said photohardenable composition including an ethylenically unsaturated compound and a photoinitiator system, and said solid diluent being miscible, as a melt, with said ethylenically unsaturated compound and not substantially inhibiting reaction of said photohardenable composition and having a melting point in the range of 35° C. to 100° C., said solid diluent being present in an amount of about 2.5 to 50 parts per 100 parts by weight of said photohardenable composition.

2. The imaging material of claim 1 wherein said solid diluent is a wax.

3. The imaging material of claim 2 wherein said wax is a fatty acid or a fatty alcohol.

4. The imaging material of claim 1 wherein said solid diluent is an aromatic hydrocarbon or an aromatic ether.

5. The imaging material of claim 1 wherein said solid diluent is selected from the group consisting of 1-docosanol, octocosane, 1-octadecanol, p-diethoxybenzene, 1,2-diphenoxyethane, bibenzyl, biphenyl, and pentamethylbenzene.

6. The imaging material of claim 1 wherein said solid diluent is beeswax.

7. The imaging material of claim 1 wherein said solid diluent forms a solid array in which said photohardenable composition is dispersed.

8. The imaging material of claim 1 wherein said solid diluent lines the inside surface of said microcapsule.

* * * * *